United States Patent [19]

Nakatsuka et al.

[11] Patent Number: 4,872,175
[45] Date of Patent: Oct. 3, 1989

[54] SEMICONDUCTOR LASER DEVICE HAVING A LENS-LIKE REFRACTIVE INDEX DISTRIBUTION WITHIN THE STRIPE

[75] Inventors: Shinichi Nakatsuka, Kodaira; Takashi Kajimura, Tokyo, both of Japan

[73] Assignee: Hitachi, Ltd., Tokyo, Japan

[21] Appl. No.: 174,421

[22] Filed: Mar. 28, 1988

[30] Foreign Application Priority Data

Mar. 27, 1987 [JP] Japan .................................. 62-71459

[51] Int. Cl.⁴ ................................................ H01S 3/19
[52] U.S. Cl. ........................................ 372/46; 372/45; 357/17
[58] Field of Search ................. 372/44, 45, 46; 357/17

[56] References Cited

U.S. PATENT DOCUMENTS 4,675,875  6/1987  Takamiya ............................... 372/46
4,703,219 10/1987  Mesquida ............................... 357/17
4,740,259  4/1988  Heinen ................................... 357/17

OTHER PUBLICATIONS

Aiki et al., "Channeled-Substrate . . . Injection Laser"; Appl. Phys. Lett., vol. 30, No. 12; Jun. 15, 1977; pp. 649–651.

Primary Examiner—William L. Sikes
Assistant Examiner—Xuân Thi Võ
Attorney, Agent, or Firm—Antonelli, Terry & Wands

[57] ABSTRACT

In a semiconductor laser device having an active layer and clad layers, lens-like portions which magnify radiation are formed in the active layer and/or a clad layer where the radiation leaks, thereby making it possible to enlarge a stripe width and to produce a fundamental mode oscillation of high output. Futher, a lens-like portion which condenses the radiation is formed at an end face of an emission port for a laser beam, thereby making it possible to narrow a radiant angle of the laser beam.

19 Claims, 6 Drawing Sheets

SEMICONDUCTOR LASER DEVICE HAVING A LENS-LIKE REFRACTIVE INDEX DISTRIBUTION WITHIN THE STRIPE

BACKGROUND OF THE INVENTION

The present invention relates to the structure of a semiconductor laser device which oscillates in the fundamental mode at a high output.

As shown in FIG. 12 by way of example, a priorart semiconductor laser has guided laser radiation by establishing the difference of effective refractive indices inside and outside a laser stripe in such a way that a region 6 exhibitive of an absorptivity for the laser radiation is disposed at a position spaced several hundred nm from the active layer 3 of the semiconductor laser. In case of the laser having such a structure, in a region of intense laser radiation, carriers within the active layer are dissipated by the stimulated emission of the laser radiation, and hence, the refractive index of the active layer increases. Especially the index increase at the part of intense radiation within the active layer becomes greater than at the other parts. Therefore, the self-focusing in which the radiation concentrates on the particular part more and more takes place to lead to the self-filamentation. Under the condition of the self-filamentation, the laser beam of the semiconductor laser shifts with the movement of a filament until the oscillation thereof shifts to a mode of higher order. For the purpose of preventing this drawback and attaining the fundamental mode oscillation, the width of the stripe needs to be reduced. When the stripe width is made smaller, the laser beam cannot shift, and the higher-order mode oscillation is cut off. With the narrow stripe, however, the light density of the laser heightens, and unfavorably the crystal thereof becomes liable to optical damages. It can accordingly be said that the reduction of the stripe width is demeritorious for the fabrication of a high-output laser.

The literature of the prior art forming the background of the present invention is, for example, "Applied Physics Letters," Vol. 30, No. 12, 1977, page 649.

SUMMARY OF THE INVENTION

An object of the present invention is to prevent the self-focusing in the prior art and to broaden the stripe width of a semiconductor laser, thereby to lower the light density of the laser and to heighten the output thereof. When the stripe width is broadened, an identical output is attained with a lower light density, and a higher optical output is attained for an identical light density.

In order to accomplish the object, according to the present invention, a lens-like refractive index distribution is formed within the stripe of the semiconductor laser, whereby the self-focusing of the laser is prevented.

More generally, the semiconductor laser device of the present invention consists in a semiconductor laser device having at least a medium for developing an optical gain, and a refractive index distribution for guiding laser radiation along the medium, characterized in that a refractive index distribution exhibiting a lens effect is formed in the medium. Here, the "medium for developing an optical gain" indicates, for example, the active layer of the semiconductor laser device and the clad part thereof into which the radiation leaks. The "refractive index distribution for guiding laser radiation along the medium" is intended to mean, for example, the relationship between the refractive indices of the active layer and the clad layer.

That is, the semiconductor laser device of the present invention consists in that lenses which magnify the radiation enough to exceed the increase of the refractive index ascribable to the dissipation of carriers are formed in the active layer and/or the clad layer into which the radiation leaks, whereby the concentration of the radiation is hindered to prevent the self-focusing.

The portion having the refractive index distribution exhibitive of the lens effect can be disposed in the active layer. In recent semiconductor lasers, however, the active layer is as thin as 0.1 μm or less, and the radiation leaks into the clad layer. Therefore, when the refractive index distribution exhibiting the lens effect exists at the part of the clad layer within 0.5–0.7 μm from the active layer, the progression of the radiation is affected, and the refractive index distribution can be formed in the clad layer. Alternatively, the index distribution may be formed in both the active layer and the clad layer. In short, the semiconductor laser device of the present invention is so constructed that the part thereof through which the laser radiation passes is formed with the portions (hereinbelow, termed "lenses") each of which has the refractive index distribution exhibitive of the lens effect of magnifying the radiation.

In a case where the refractive index inside the lens is lower than the refractive index of the layer formed with the lenses (the refractive index outside the lens), the lens is shaped to be convex, and in a case where the refractive index inside the lens is higher than the refractive index outside the lens, the lens is shaped to be concave.

The lenses are arrayed at pitches d within the stripe of the laser device.

The effective refractive indices of the layer formed with the lenses, inside and outside the lenses are denoted by $n_1$ and $n_2$ respectively. The symbol $k_1$ denotes an effective refractive index at the well-known apex of a self-focusing region exhibiting a parabolic distribution, and $k_2$ denotes the coefficient of a square term in a formula indicating the parabolic distribution. Further, R denotes the radius of curvature of each lens (here, R has a plus value when the center of the curvature lies on the side of a material exhibiting the refractive index $n_1$, and R has a minus value when the center lies on the side of a material exhibiting the refractive index $n_2$). Then, the values of the radius R and the pitch d may be determined so as to satisfy an inequality mentioned below. The effective refractive index is an apparent refractive index for the progressing laser radiation as is well known. Since the radiation leaks into the clad layer, the effective refractive index takes a value different from the refractive index of the layer itself where the lenses exist, but a method of determining the effective index is known. In a semiconductor laser employing GaAs- and AlGaAs-system compounds, all the values $n_1$, $n_2$ and $k_1$ are about 3.4, the absolute value of a difference $(n_2-n_1)$ is $5\times10^{-3}-2\times10^{-2}$, and the value $k_2$ is about $4\times10^{-5}$. The values of the indices $n_1$ and $n_2$ are almost equal, and may be the same in approximation. However, they have the slight difference $(n_2-n_1)$, the value of which is an important factor greatly influential on the determination of the radius R and the pitch d.

$$\cos\left(\sqrt{\frac{k_2}{k_1}}\, d\right) +$$

$$\frac{2(n_2 - n_1)}{n_2 R} \sqrt{\frac{k_1}{k_2}} \sin\left(\sqrt{\frac{k_2}{k_1}}\, d\right) > 1$$

Except for the formation of the lenses, the structure of the semiconductor device of the present invention may be the same as the structure of the prior art. In addition, the thicknesses of respective semiconductor layers constituting the laser device may be the same as in the prior art. The stripe width, however, can be greatly increased. In practical use, the stripe width is set in consideration of the intended application of the laser device, the light intensity thereof, a processing accuracy for the fabrication of the lens portion, etc.

According to the present invention, the self-focusing of a semiconductor laser can be prevented, so that a laser of broad stripe width can be oscillated in the fundamental mode, and an output several times higher than those of conventional semiconductor lasers can be attained.

Further, a lens-like refractive index distribution effective to concentrate radiation is formed at the end face of an exit port for the laser radiation, whereby the radiant angle of the laser radiation can be narrowed.

DESCRIPTION OF THE PREFERRED EMBODIMENTS

Embodiment 1

Figure 2:
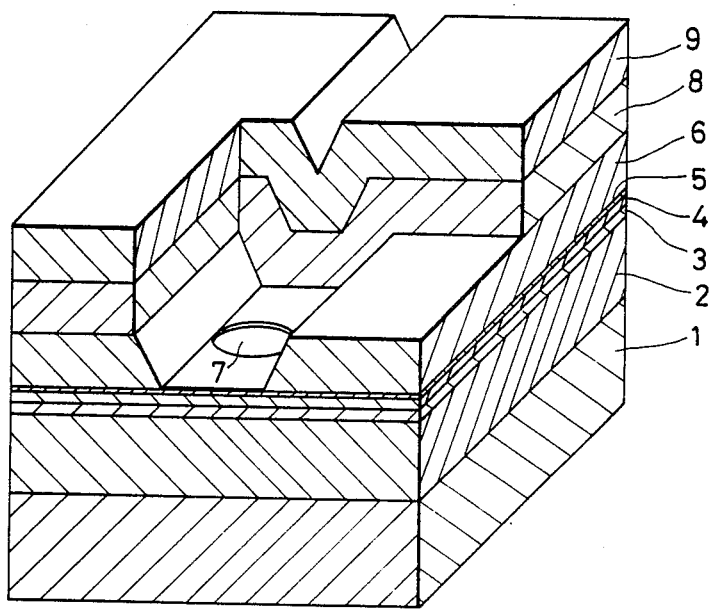
FIG. 2 is a perspective view of a semiconductor laser structure in the first embodiment of the present invention.

FIG. 2 is a perspective view showing a semiconductor laser device, in which a part of a portion including lenses is cut open. Incidentally, also in each of FIGS. 3–7 which are perspective views showing semiconductor lasers, a part of a portion including lenses is cut open.

On an n-GaAs substrate 1, and using MOCVD (organometallic chemical vapor deposition) method, there were successively grown an n-$Ga_{0.5}Al_{0.5}As$ clad layer 2 having a thickness of 1.5 $\mu$m, a $Ga_{0.86}Al_{0.14}As$ active layer 3 having a thickness of 0.07 $\mu$m, a p-$Ga_{0.5}Al_{0.5}As$ clad layer 4 having a thickness of 0.3 $\mu$m, a p-$Ga_{0.7}Al_{0.3}As$ layer 5 having a thickness of 0.2 $\mu$m, and an n-GaAs light absorption layer 6 having a thickness of 1.0 $\mu$m. Thereafter, a striped $SiO_2$ pattern was formed using conventional photolithography, and a selected part of the n-GaAs light absorption layer 6 was removed by reactive ion etching. Further, by performing a photolithographic step again, the p-$Ga_{0.7}Al_{0.3}As$ layer 5 was processed into a configuration shown in FIG. 1 in which lenslike pit portions 7 recurred along the stripe. Subsequently, the burying growth of two layers consisting of a p-$Ga_{0.5}Al_{0.5}As$ layer 8 at a thickness of 1.5 $\mu$m and a p-GaAs cap layer 9 at a thickness of 0.5 $\mu$m was carried out into a structure as shown in FIG. 2. Thus, the material of the p-$Ga_{0.5}Al_{0.5}As$ layer 8 was buried as lenses into the pit portions 7 of the p-$Ga_{0.7}Al_{0.3}As$ layer 5. In addition, the p-$Ga_{0.5}Al_{0.5}As$ layer 8 served as a clad layer continuous to the p-$Ga_{0.5}Al_{0.5}As$ clad layer 4. The p-$Ga_{0.7}Al_{0.3}As$ layer 5 served to dispose the lenses for affording a refractive index variation, and the lenses were formed on the basis of the difference between the refractive indices of the part where the material of this layer exists and the parts where it does not exist, namely, the pit portions.

One period (distance d indicative of the pitch of the lenses) of such a lens-like structure (having a radius of curvature R) subjects the position and direction of laser radiation to conversion as expressed by the following matrix:

$$\begin{bmatrix} 1 & 0 \\ \frac{2(n_2 - n_1)}{n_2 R} & 1 \end{bmatrix}$$

On the other hand, in a case where a radiation focusing effect ascribable to the dissipation of carriers by the laser radiation occurs between the lenses, the matrix becomes as follows on the assumption that the propagation constant of the radiation can be approximated by $k = k_1 - \frac{1}{2}k_2 x^2$ where x denotes a variable indicating a position and corresponds to a distance from a predetermined point:

$$\begin{bmatrix} \cos\left(\sqrt{\frac{k_2}{k_1}}\, d\right) & \sqrt{\frac{k_1}{k_2}} \sin\left(\sqrt{\frac{k_2}{k_1}}\, d\right) \\ -\sqrt{\frac{k_2}{k_1}} \sin\left(\sqrt{\frac{k_2}{k_1}}\, d\right) & \cos\left(\sqrt{\frac{k_2}{k_1}}\, d\right) \end{bmatrix}$$

The parameters of the matrix may satisfy the following inequality lest the above-stated system should cause the focusing effect of the laser:

$$\cos\left(\sqrt{\frac{k_2}{k_1}}\, d\right) + \frac{2(n_2 - n_1)}{n_2 R}\sqrt{\frac{k_1}{k_2}}\sin\left(\sqrt{\frac{k_2}{k_1}}\, d\right) > 1$$

In the present embodiment, the values of the refractive indices $n_1$, $n_2$ and $k_1$ were set at 3.4, the value of the coefficient $k_2$ was set at $4\times 10^{-5}$, and the value of the difference of the indices $n_2$ and $n_1$ was set at about $1\times 10^{-2}$. Thus, $R=15$ μm and $d=10$ μm were set on the basis of the aforementioned calculation. Then, a semiconductor laser which oscillated in a stable fundamental lateral mode up to an optical output of 200 mW was obtained with a device having a stripe width of 10 μm.

In the ensuing embodiments, the values of $n_1$, $n_2$ and $k_1$ were set at 3.4, the value of $k_2$ was set at $4\times 10^{-5}$, and the value of the difference between $n_2$ and $n_1$ was set at about $1\times 10^{-2}$.

Figure 1:
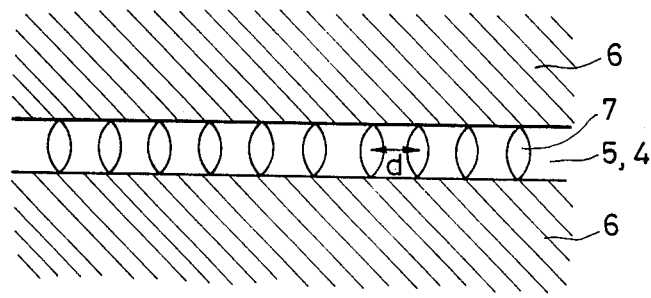
FIG. 1 is an explanatory view showing the plan array of the lens portion of a semiconductor laser device according to a the present invention.

Although only one lens is seen in FIG. 2, the large number of lenses are actually arrayed as illustrated in FIG. 1. Also in the embodiments of FIGS. 3-6, a large number of lenses are actually arrayed.

Embodiment 2

Figure 3:
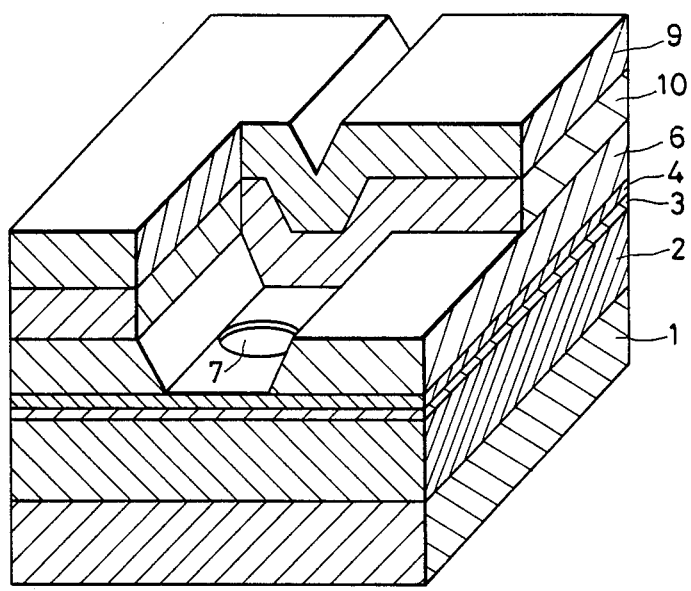
FIG. 3 is a perspective view of a semiconductor laser structure in the second embodiment of the present invention.

As the second embodiment of the present invention, a semiconductor laser having a structure as shown in FIG. 3 was manufactured by way of example. On an n-GaAs substrate 1, and using MOCVD method, there were successively grown an n-$Ga_{0.5}Al_{0.5}As$ clad layer 2, a $Ga_{0.86}Al_{0.14}As$ active layer 3, a p-$Ga_{0.5}Al_{0.5}As$ clad layer 4, and an n-GaAs light absorption layer 6. Thereafter, a striped SiO2 pattern was formed using conventional photolithography, and a selected part of the n-GaAs light absorption layer 6 was removed by reactive ion etching. Further, by performing a photolithographic step again, the p-$Ga_{0.5}Al_{0.5}As$ clad layer 4 was processed into the configuration shown in FIG. 1 in which lens-like pit portions 7 recurred along the stripe. Subsequently, the burying growth of two layers consisting of a p-$Ga_{0.7}Al_{0.3}As$ layer 10 at a thickness of 1.5 μm and a p-GaAs cap layer 9 was carried out into the structure as shown in FIG. 3. The thicknesses of the respective layers were the same as in Embodiment 1, except that the p-$Ga_{0.7}Al_{0.3}As$ layer 10 was set at the above thickness of 1.5 μm.

In the present embodiment, the material of the p-$Ga_{0.7}Al_{0.3}As$ layer 10 was buried as lenses into the pit portions of the p-$Ga_{0.5}Al_{0.5}As$ clad layer 4. In addition, the p-$Ga_{0.7}Al_{0.3}As$ layer 10 served as a part of the clad layer portion.

The lens-like portions as stated above were designed on the basis of the same calculation as in the case of Embodiment 1. When $R=15$ μm and and $d=10$ μm were set, a semiconductor laser which oscillated in a stable fundamental lateral mode up to an optical output of 200 mW was obtained with a device having a stripe width of 10 μm.

Embodiment 3

Figure 4:
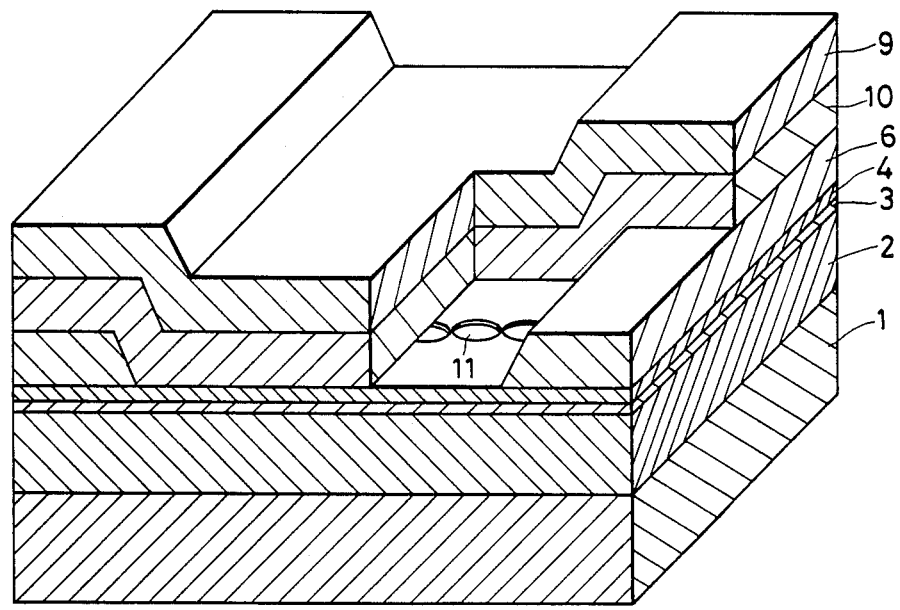
FIG. 4 is a perspective view of a semiconductor laser structure in the third embodiment of the present invention.

As the third embodiment of the present invention, there was manufactured by way of trial a semiconductor laser in which, in order to attain a higher output, the stripe width in the structure of Embodiment 1 or 2 was expanded, and lens-like portions 11 were formed into a two-dimensional array as shown in FIG. 4. Conditions for preventing the occurrence of self-filamentation were evaluated by the same calculation as in Embodiment 1. On the basis of this calculation, ten lenses of $R=15$ μm and $d=10$ μm each having a width of 10 μm were arranged within the stripe 100 μm wide so as to form the two-dimensional lens array. Then, a semiconductor laser oscillating in a stable fundamental lateral mode up to an optical output of 1 W was obtained.

Embodiment 4

Figure 5:
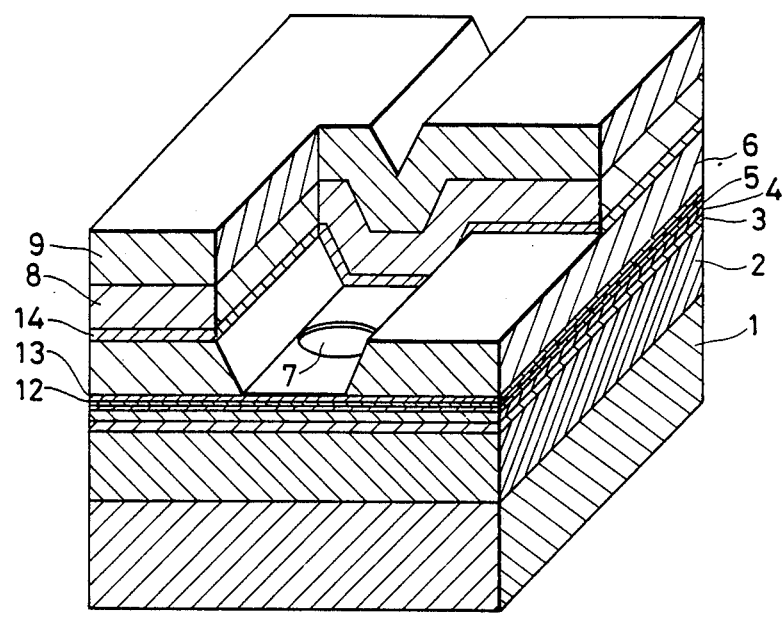
FIG. 5 is a perspective view of a semiconductor laser structure in the fourth embodiment of the present invention.

As the fourth embodiment of the present invention, a semiconductor laser of a structure as shown in FIG. 5 was manufactured by way of trial. On an n-GaAs substrate 1, and using MOCVD method, there were successively grown an n-$Ga_{0.5}Al_{0.5}As$ clad layer 2, a $Ga_{0.86}Al_{0.14}As$ active layer 3, a p-$Ga_{0.5}Al_{0.5}As$ clad layer 4, a p-$Ga_{0.7}Al_{0.3}As$ layer 5, a p-GaAs quantum well layer 12, a p-$Ga_{0.7}Al_{0.3}As$ layer 13, and an n-GaAs light absorption layer 6. Thereafter, a striped SiO2 pattern was formed using conventional photolithography, and a selected part of the n-GaAs light absorption layer 6 was removed by reactive ion etching. Further, by performing a photolithographic step again, the p-$Ga_{0.7}Al_{0.3}As$ layer 13 was processed into the configuration shown in FIG. 1 in which lens-like pit portions recurred along the stripe. Subsequently, the burying growth of three layers consisting of a $p^+$-$Ga_{0.5}Al_{0.5}As$ layer 14 doped with Zn, a p-$Ga_{0.5}Al_{0.5}As$ layer 8 and a p-GaAs cap layer 9 was carried out into the structure as shown in FIG. 5. The thicknesses of the respective layers were the same as in Embodiment 1 except that the p-GaAs quantum well layer 12 was made 0.2 μm thick, that the p-$Ga_{0.7}Al_{0.3}As$ layer 13 was made 0.2 μm thick, and that the $p^+$-$Ga_{0.5}Al_{0.5}As$ layer 14 was made 0.3 μm thick. Next, the resultant structure was heat-treated at 850° C. for 60 minutes while an As pressure was kept applied in an MOCVD equipment. As a result, Zn contained in the $P^+$-$Ga_{0.5}Al_{0.5}As$ layer 14 was rediffused into the p-GaAs quantum well layer 12 through the lens-like pit portions provided in the p-$Ga_{0.7}Al_{0.3}As$ layer 13, and the parts of the p-GaAs quantum well layer 12 corresponding to the lens-like pits of the p-$Ga_{0.7}Al_{0.3}As$ layer 13 were brought into a mixed crystal in the shape of lenses. A lens-like structure similar to that of any of Embodiments 1-3 was formed owing to the difference between the refractive indices of quantum well portions which were rendered into the mixed crystal and quantum well portions which were not rendered.

In the present embodiment, the p-$Ga_{0.7}Al_{0.3}As$ layer 13 served also as a continuous clad layer, and the $p^+$-$Ga_{0.5}Al_{0.5}As$ layer 14 served as the diffusion source of Zn for the p-GaAs quantum well layer 12.

When $R=15$ μm and $d=10$ μm were set on the basis of the calculation in Embodiment 1, a semiconductor laser oscillating in a stable fundamental lateral mode up to an optical output of 200 mW was obtained with a device having a stripe width of 10 μm. Incidentally, the rediffusion technique in the present invention is effective, not only for establishing the refractive index distribution, but also for improving the electric connection of a regrown boundary. Even when the rediffusion technique is applied to a conventional self-aligned structure having no lens portions, the effect of lowering the series resistance of an element is achieved.

Embodiment 5

Figure 6:
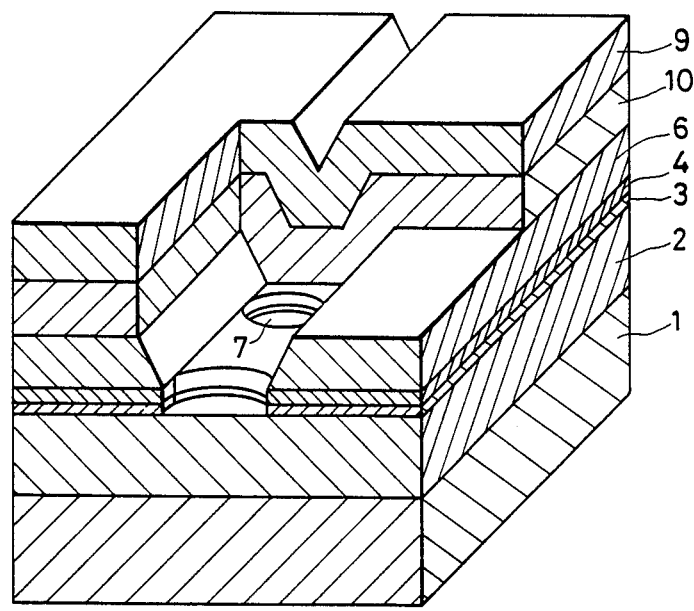
FIG. 6 is a perspective view of a semiconductor laser structure in the fifth embodiment of the present invention.

As the fifth embodiment of the present invention, a semiconductor laser of a structure as shown in FIG. 6 was manufactured by way of trial. On an n-GaAs substrate 1, and using MOCVD method, there were successively grown an n-$Ga_{0.5}Al_{0.5}As$ clad layer 2, a $Ga_{0.86}Al_{0.14}As$ active layer 3, a p-$Ga_{0.5}Al_{0.5}As$ clad layer 4, and an n-GaAs light absorption layer 6. Thereafter, a striped $SiO_2$ pattern was formed using conventional photolithography, and a selected part of the n-GaAs light absorption layer 6 was removed by reactive ion etching. Further, by performing a photolithographic step again, the $Ga_{0.86}Al_{0.14}As$ active layer 3 and the p-$Ga_{0.5}Al_{0.5}As$ layer 4 were processed into the configuration shown in FIG. 1 in which lens-like portions 7 recurred along the stripe. Subsequently, the burying growth of two layers consisting of a p-$Ga_{0.7}Al_{0.3}As$ layer 10 and a p-GaAs cap layer 9 was carried out into the structure as shown in FIG. 6. The thicknesses of the respective layers were the same as in each of the preceding embodiments. Such lens-like portions were designed on the basis of the same calculation as in the case of Embodiment 1. When $R=15$ $\mu m$ and $d=10$ $\mu m$ were set, a semiconductor laser oscillating in a stable fundamental lateral mode up to an optical output of 200 mW was obtained with a device having a stripe width of 10 $\mu m$.

Embodiment 6

Figure 7:
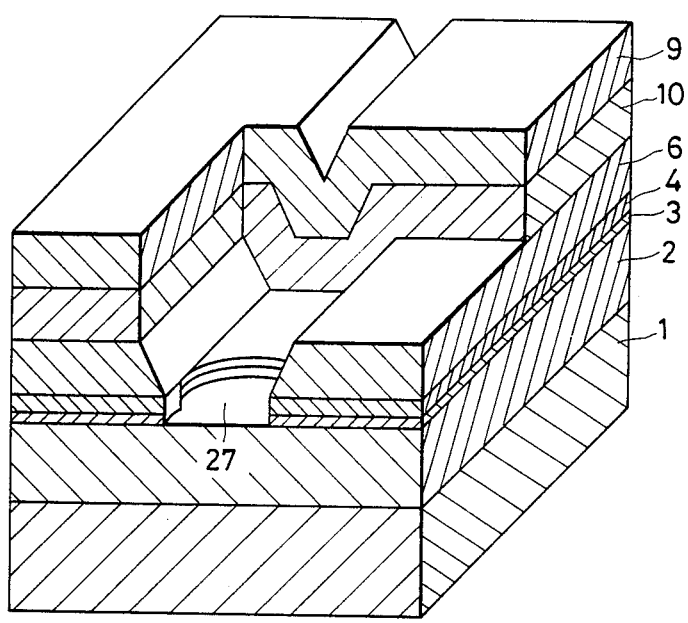
FIG. 7 is a perspective view of a semiconductor laser structure in the sixth embodiment of the present invention.
Figure 8:
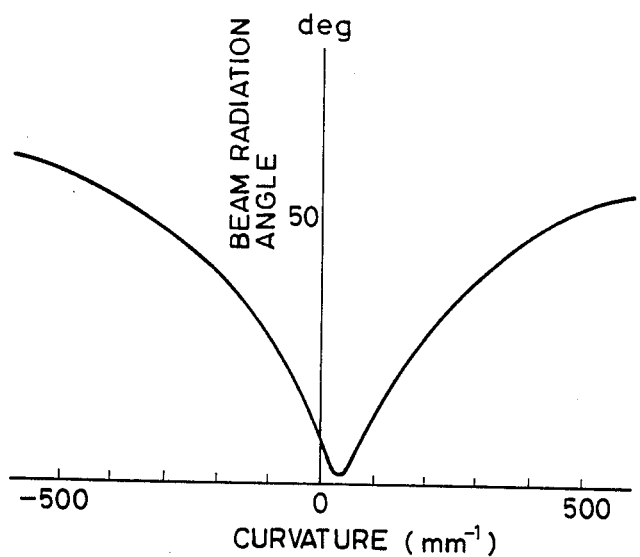
FIG. 8 is a diagram showing the relationship of the radiant angle of a laser beam versus the curvature of a light condensing lens formed at an exit port for the laser beam.

In the first-fifth embodiments of the present invention, there has been stated the technique according to which the self-filamentation of the semiconductor laser is prevented by the lens-like structure formed within the laser device and being effective to magnify light. Such a refractive index distribution having the lens effect can also be used for correcting the emitting beam of a semiconductor laser when it is materialized as a light condensing lens. More specifically, a semiconductor laser of a structure as shown in FIG. 7 was manufactured by way of trial as the sixth embodiment of the present invention. On an n-GaAs substrate 1, and using MOCVD method, there were successively grown an n-$Ga_{0.5}Al_{0.5}As$ clad layer 2, a $Ga_{0.86}Al_{0.14}As$ active layer 3, a p-$Ga_{0.5}Al_{0.5}As$ clad layer 4, and an n-GaAs light absorption layer 6. Thereafter, a striped $SiO_2$ pattern was formed using conventional photolithography, and a selected part of the n-GaAs light absorption layer 6 was removed by reactive ion etching. Further, by performing a photolithographic step again, the p-$Ga_{0.86}Al_{0.14}As$ active layer 3 and the p-$Ga_{0.5}Al_{0.5}As$ layer 4 were processed into a configuration shown in FIG. 7 in which a lens-like recess 27 was formed at the end of the stripe. Subsequently, the burying growth of two layers consisting of a p-$Ga_{0.7}Al_{0.3}As$ layer 10 and a p-GaAs cap layer 9 was carried out into the structure as shown in FIG. 7. The thicknesses of the respective layers were the same as in each of the preceding embodiments. The radiant angle of a laser beam emitted from the semiconductor laser of such a structure is shown in FIG. 8 for an example in which the stripe was 10 $\mu m$ wide. The radius of curvature R was set at $R=30$ $\mu m$ referring FIG. 8 so as to make the radiant angle of the emission beam narrowest. Then, a semiconductor laser exhibiting favorable characteristics of the narrow beam radiant angle was obtained.

It is also possible to employ both the lenses for magnifying the light and the light condensing lens disposed near the end face of the laser device as described in the present embodiment.

Embodiment 7

Figure 9:
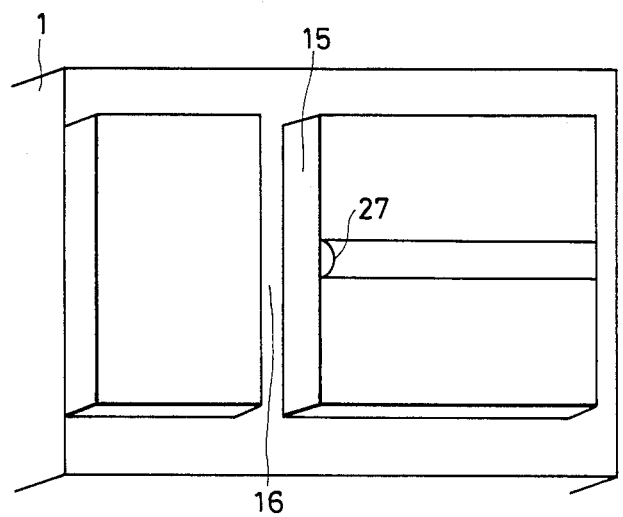
FIG. 9 is an explanatory view of a semiconductor laser structure in the seventh embodiment of the present invention.

The seventh embodiment of the present invention is shown in FIG. 9. A well-known complex cavity laser for reducing the optical feed back noise of a semiconductor laser was manufactured by way of trial by adopting the lens-like structure formed near the end face in Embodiment 6. The structure of the semiconductor laser fabricated in the present embodiment was similar to that of Embodiment 6 (FIG. 7), but it was formed with the end face 15 having the lens and a reflective surface 16 opposing to the end face by reactive ion etching. According to this structure, a laser beam emitted from the laser end face was efficiently reflected back to the end face, so that a good complex cavity laser was constructed, and a favorable characteristic of reducing the optical feed back noise was attained.

Embodiment 8

Figure 10:
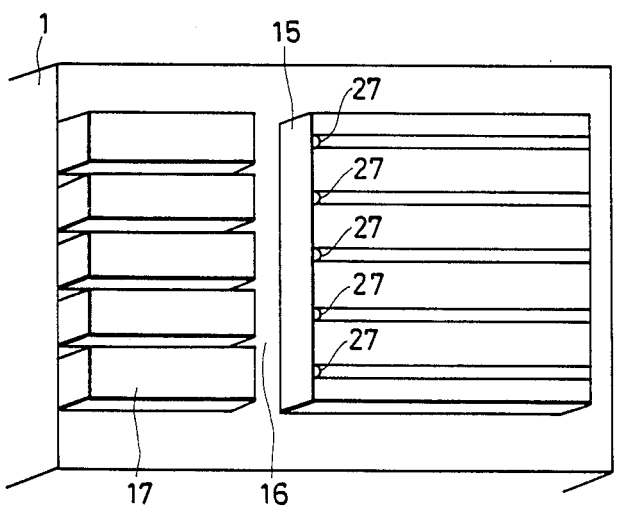
FIG. 10 is an explanatory view of a semiconductor laser structure in the eighth embodiment of the present invention.

The eighth embodiment of the present invention is shown in FIG. 10. A device capable of monitoring the optical outputs of the individual stripes of a phase-locked semiconductor laser array was manufactured by way of trial by adopting the lens-like structures formed near the end faces as shown in Embodiment 6. The structure of the semiconductor laser device fabricated in the present embodiment was such that five laser stripes each being similar to the laser stripe of Embodiment 6 were arrayed at intervals of 5 $\mu m$. In addition, monitoring photodiodes 17 which utilized the p-n junctions of the semiconductor lasers were formed in opposition to the corresponding end faces 15 with lenses, by reactive ion etching. Numeral 16 indicates the reflective surface of the photodiode 17. According to this structure, the output beams of the phase-locked laser array entered the corresponding monitor diodes without mixing, so that the outputs of the respective stripes of the laser array could be monitored independently.

Embodiment 9

Figure 11:
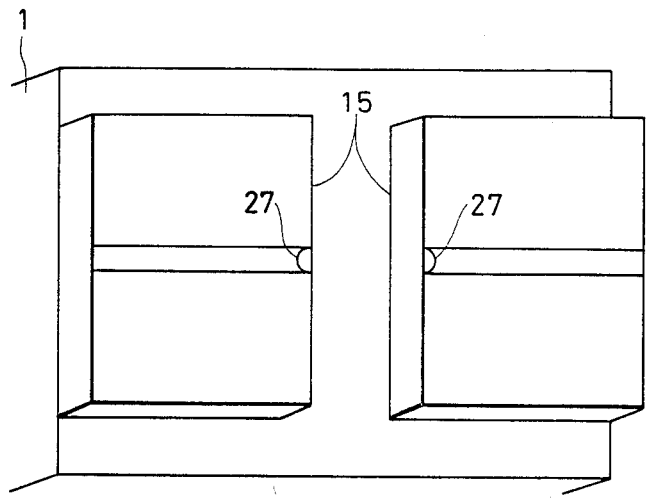
FIG. 11 is an explanatory view of a semiconductor laser structure in the ninth embodiment of the present invention.
Figure 12:
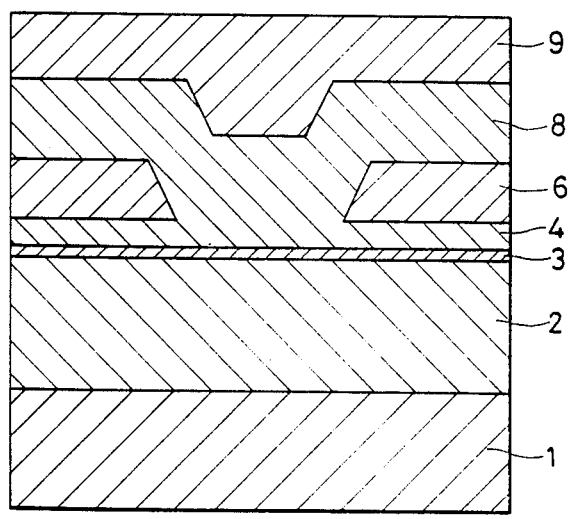
FIG. 12 is a sectional view of a semiconductor laser structure in a prior art.

The ninth embodiment of the present invention is shown in FIG. 11. A well-known bistable semiconductor laser having laser cavities arrayed in series was manufactured by way of trial by adopting the lens-like structures formed near the end faces as shown in Embodiment 6. The structure of the semiconductor laser fabricated in the present embodiment was similar to that of Embodiment 6, but it was formed with the end faces 15 having light condensing lenses so as to oppose each other by reactive ion etching. According to this structure, the radiant angles of emission beams were narrow, so that the optical coupling between the cavities was favorable, and a good bistable semiconductor laser was obtained.

In any of the drawings illustrative of the semiconductor laser devices corresponding to the respective embodiments, the refractive index distribution portion is depicted in the shape of a convex lens. However, the depiction is merely for the sake of convenience, and both the convex lens and a concave lens are employed depending upon the refractive indices of the lens portion and a material formed with this lens portion. In addition, although the center of curvature of the lens portion lies on the center axis of the stripe in each of Embodiments 1, 2, 4 and 5, the arrangement of the lens pit portions need not be restricted thereto as long as the effect of magnifying the laser radiation is noted.

In any of the foregoing embodiments, the laser device having the well-known light absorption layer 6 is referred to. However, the light absorption layer is not the essential constituent of the present invention, but the present invention is applicable to almost all semiconductor laser devices having stripe structures. The laser device of each embodiment comprises the light absorption layer merely for the reason that semiconductor laser devices of such a structure are often used at present.

Throughout the drawings, identical reference numerals indicate substantially the same portions.

In the prior art, the stripe width of which the highest optical output can be expected is 3–5 μm, whereas in each of the embodiments, the stripe width is 10 μm. It has been verified that there is an effect even when the stripe width is enlarged to 40 μm by the application of the present invention. As compared with a narrow stripe, a broadened stripe can produce an identical optical output at a lower light density and can remarkably heighten an optical output at an identical light density. With the prior art, when the stripe width is enlarged, it is difficult to produce a high output under a stable oscillation. In contrast, according to the present invention, even when the stripe width is 10 μm or greater, a high output and a stable oscillation can be attained, and the output of a single fundamental mode can be increased to double or more of that in the prior art.

What is claimed is:

1. In a semiconductor laser device wherein a first clad layer made of a semiconductor having a first conductivity type, an active layer, and a second clad layer made of a semiconductor having a second conductivity type opposite to said first conductivity type are disposed on a substrate; the improvement comprising lens-like portions which exhibit a refractive index distribution having a lens effect of magnifying light formed in a stripe of said laser device and in at least one of said active layer and a part of one or both of said first and second clad layers into which light leaks from said active layer wherein said lens-like portions are shaped to be convex when a refractive index in said lens-like portions is lower than a refractive index of the layer in which the lens-like portions are formed, and said lens-like portions are shaped to be concave when a refractive index in said lens-like portions is higher than a refractive index of the layer in which the lens-like portions are formed.

2. In a semiconductor laser device wherein a first clad layer made of a semiconductor having a first conductivity type, an active layer, and a second clad layer made of a semiconductor having a second conductivity type opposite to said first conductivity type are disposed on a substrate; the improvement comprising lens-like portions which exhibit a refractive index distribution having a lens effect of magnifying light formed in a stripe of said laser device and in at least one of said active layer and a part of one or both of said first and second clad layers into which light leaks from said active layer wherein said lens-like portions are shaped to be convex when a refractive index in said lens-like portions is lower than a refractive index of the layer in which the lens-like portions are formed, and said lens-like portions are shaped to be concave when a refractive index in said lens-like portions is higher than a refractive index of the layer in which the lens-like portions are formed, and further wherein a radius of curvature R of each lens-like portion and a pitch d of said lens-like portions satisfy the following inequality:

$$\cos\left(\sqrt{\frac{k_2}{k_1}}\, d\right) + \frac{2(n_2 - n_1)}{n_2 R}\sqrt{\frac{k_1}{k_2}}\sin\left(\sqrt{\frac{k_2}{k_1}}\, d\right) > 1$$

wherein $n_1$ denotes an effective refractive index inside said lens-like portions and $n_2$ denotes an effective refractive index outside said lens-like portions in the layer in which said lens-like portions are formed, $k_1$ denotes an effective refractive index at an apex of a self-focusing region having a parabolic distribution, and $k_2$ denotes a coefficient in a square term of an equation indicative of the parabolic distribution.

3. A semiconductor laser device as defined in claim 2, wherein said active layer and said clad layers are made of a GaAs system compound including $Ga_xAl_{1-x}As$, and values of each of the effective refractive indices $n_1$, $n_2$ and $k_1$ are about 3.4, while a value of the coefficient $k_2$ is about $4 \times 10^{-5}$.

4. A semiconductor laser device as defined in claim 3, wherein an absolute value of an index difference $(n_2 - n_1)$ is $5 \times 10^{-3} - 2 \times 10^{-2}$.

5. A semiconductor laser device as defined in claim 1, further comprising another lens-like portion which exhibits a refractive index distribution having a lens effect of condensing light, said another lens-like portion being formed in said active layer at an end face of said stripe, the end face serving as an emission port for a laser beam of said laser device.

6. A semiconductor laser device having a stripe, a resonant cavity and a pumping means wherein a first clad layer made of a semiconductor having a first conductivity type, an active layer, and a second clad layer made of a semiconductor having a second conductivity type opposite to said first conductivity type are disposed on a substrate; lens-like portions which exhibit a refractive index distribution having a lens effect of magnifying light formed in a stripe of said laser device and in at least one of said active layer and a part of one or both of said first and second clad layers into which light leaks from said active layer wherein said lens-like portions are shaped to be convex when a refractive index in said lens-like portions is lower than a refractive index of the layer in which the lens-like portions are formed, and said lens-like portions are shaped to be concave when a refractive index in said lens-like portions is higher than a refractive index of the layer in which the lens-like portions are formed.

7. In a semiconductor laser device having a stripe wherein a first clad layer made of a semiconductor having a first conductivity type, an active layer, and a second clad layer made of a semiconductor having a second conductivity type opposite to said first conductivity type are disposed on a substrate; a waveguide structure including lens-like portions which exhibit a refractive index distribution having a lens effect of magnifying light formed in a stripe of said laser device and in at least one of said active layer and a part of one or both of said first and second clad layers into which light leaks from said active layer wherein said lens-like portions are shaped to be convex when a refractive index in said lens-like portions is lower than a refractive index of the layer in which the lens-like portions are formed, and said lens-like portions are shaped to be concave when a refractive index in said lens-like portions is higher than a refractive index of the layer in which the lens-like portions are formed.

8. In a semiconductor laser device including:
a semiconductor substrate;
a first clad layer formed on said substrate;
an active layer formed on said first clad layer;
a second clad layer formed on said active layer;
a light absorbing layer formed on said second clad layer, and being shaped into a stripe formation;
the improvement comprising;
lens-like portions formed in at least one of said layers exposed below said light absorbing layer;
a third clad layer formed on said light absorbing layer and said lens-like portions, so as to be buried in said lens-like portions; and
a cap layer formed on said third clad layer.

9. A semiconductor laser device according to claim 8, further including a semiconductor layer formed between said second clad layer and said light absorbing layer.

10. A semiconductor laser device according to claim 8, wherein said lens-like portions are formed in at least said semiconductor layer.

11. A semiconductor laser device according to claim 8, wherein said lens-like portions are formed in at least said second clad layer.

12. A semiconductor laser device according to claim 8, wherein said lens-like portions extend in a two-dimensional array.

13. A semiconductor laser device according to claim 8, wherein said lens-like portions are formed in at least said second clad layer and said active layer.

14. A semiconductor laser device according to claim 8, further including a quantum well structure formed on said second clad layer; a semiconductor layer formed on said quantum well structure in which said lens-like portions are formed; and a zinc doped layer formed on said light absorbing layer and buried in said lens-like portions, for diffusing zinc into said quantum well structure.

15. A semiconductor laser device according to claim 13, wherein a stripe of said laser device has a width of 10-40 $\mu$m.

16. A semiconductor laser device according to claim 8, further including another lens-like portion formed in at least said second clad layer at the end face of a stripe of said laser device.

17. A semiconductor laser device according to claim 16, wherein said end face is positioned to be opposite to a reflective surface of said laser device.

18. A semiconductor laser device according to claim 8, wherein said laser device includes a plurality of stripes each having an end face positioned to be opposite to monitoring photodiodes of said laser device, and further lens-like portions formed in at least said second clad layer at said end face of each stripe.

19. A semiconductor laser device according to claim 8, wherein said laser device includes a plurality of laser cavities coupled together.

* * * * *